US011929105B2

United States Patent
Wu et al.

(10) Patent No.: US 11,929,105 B2
(45) Date of Patent: Mar. 12, 2024

(54) METHOD OF FABRICATING A SEMICONDUCTOR DEVICE

(71) Applicant: CHANGXIN MEMORY TECHNOLOGIES, INC., Hefei (CN)

(72) Inventors: Baolei Wu, Hefei (CN); Xiaoguang Wang, Hefei (CN); Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 267 days.

(21) Appl. No.: 17/504,005

(22) Filed: Oct. 18, 2021

(65) Prior Publication Data
US 2022/0208243 A1 Jun. 30, 2022

Related U.S. Application Data

(63) Continuation of application No. PCT/CN2021/097951, filed on Jun. 2, 2021.

(30) Foreign Application Priority Data

Dec. 29, 2020 (CN) .......................... 202011593446.1

(51) Int. Cl.
G11C 11/00 (2006.01)
G11C 11/16 (2006.01)
(Continued)

(52) U.S. Cl.
CPC ........ *G11C 11/1675* (2013.01); *G11C 11/161* (2013.01); *G11C 11/1659* (2013.01);
(Continued)

(58) Field of Classification Search
CPC ......... G11C 11/16; G11C 11/15; H01L 43/03; H01L 27/238
(Continued)

(56) References Cited

U.S. PATENT DOCUMENTS 8,841,139 B2 * 9/2014 Kamata .................. H10B 61/22
438/455
10,290,679 B1 5/2019 Bhushan et al.
(Continued)

FOREIGN PATENT DOCUMENTS

CN 105448320 A 3/2016
CN 105449099 A 3/2016
(Continued)

OTHER PUBLICATIONS

Tian-Yue Chen, AL. "Efficient Spin-Orbit Torque Switching with Nonepitaxial Chalcogenide Heterostructures", ACS Appl. Mater. Interfaces 2020, 12, 6, 7788-7794.
(Continued)

*Primary Examiner* — Son T Dinh
(74) *Attorney, Agent, or Firm* — Ladas & Parry LLP

(57) ABSTRACT

The present application makes public a magnetic memory and a reading/writing method thereof, which magnetic memory comprises at least one cell layer, and the cell layer includes a plurality of parallel second wires that are disposed in a second plane, the first plane being parallel to the second plane, and projections of the second wires onto the first plane intercrossing the first wires; a plurality of storage elements that are disposed between the first plane and the second plane, the storage elements including magnetic tunnel junctions and bi-directional gating components connected in series along a direction perpendicular to the first plane, the magnetic tunnel junctions being connected to the first wires, the bi-directional gating components being connected to the second wires, and the bi-directional gating components being configured to be conductive upon application of a threshold voltage and/or a threshold current.

17 Claims, 5 Drawing Sheets

(51) Int. Cl.
  *H10B 61/00* (2023.01)
  *H10N 50/80* (2023.01)
(52) U.S. Cl.
  CPC .......... *G11C 11/1673* (2013.01); *H10B 61/22* (2023.02); *H10N 50/80* (2023.02)
(58) Field of Classification Search
  USPC .................................................. 365/158, 171
  See application file for complete search history.

(56) References Cited

U.S. PATENT DOCUMENTS

| | | | | |
|---|---|---|---|---|
| 2002/0000597 | A1* | 1/2002 | Okazawa | ............... H10B 61/00 |
| | | | | 257/E27.005 |
| 2009/0034320 | A1* | 2/2009 | Ueda | ................... G11C 11/1659 |
| | | | | 365/158 |
| 2009/0262571 | A1* | 10/2009 | Sakimura | ............ G11C 11/1659 |
| | | | | 365/158 |
| 2017/0104028 | A1 | 4/2017 | Shepard | |
| 2018/0019392 | A1 | 1/2018 | Lee et al. | |

FOREIGN PATENT DOCUMENTS

| | | |
|---|---|---|
| CN | 107112049 A | 8/2017 |
| WO | 20200167405 A1 | 8/2020 |
| WO | WO-2020192201 A1 * | 10/2020 ......... G11C 14/0036 |

OTHER PUBLICATIONS

Hongxin Yang, AL. "Threshold Switching Selector and 1S1R Integration Development for 3D Cross-point STT-MRAM", 2017 IEEE International Electron Devices Meeting (IEDM), San Francisco, California (USA), Dec. 2-6, 2017.
International Search Report and Written Opinion for application No. PCT/CN2021/097951, dated Jul. 26, 2021, 9 pages.

* cited by examiner

US 11,929,105 B2

METHOD OF FABRICATING A SEMICONDUCTOR DEVICE

CROSS-REFERENCE TO RELATED APPLICATIONS

This application is a continuation of International Patent Application No. PCT/CN2021/097951 filed on Jun. 2, 2021, which claims priority to Chinese Patent Application No. 202011593446.1 filed on Dec. 29, 2020. The above-referenced patent applications are incorporated herein by reference in their entirety.

TECHNICAL FIELD

The present application relates to the field of integrated circuits, and more particularly to a magnetic memory and its reading/writing method.

BACKGROUND

The magnetoresistive random access memory (MRAM) is a type of nonvolatile magnetic memories, and it provides a performance corresponding to that of a volatile static random access memory (SRAM) and a density and relatively low power consumption corresponding to those of a volatile dynamic random access memory (DRAM). In comparison with a nonvolatile memory (NVM) i.e. a flash memory, the MRAM provides quicker access time, and endures the least degeneration with the passing of time, while the flash memory can be rewritten only for a limited number of times.

The essence of the MRAM's elements is the magnetic tunnel junction (MTJ), which can include a fixed magnetic layer and a free magnetic layer, the magnetization polarity of the fixed magnetic layer is invariable, and the magnetization polarity of the free magnetic layer is variable. Due to the tunnel magnetic resistance effect, the resistance value between the fixed magnetic layer and the free magnetic layer is varied with variation of the magnetization polarity in the free magnetic layer, whereby is realized the writing-in of the magnetic memory.

However, memory density is a main factor hindering the marketing of MRAMs in the memory/storage market, it is therefore a problem to be urgently dealt with at present as how to enhance the density of the magnetic memory.

SUMMARY

Objectives of the present application are to provide a high-density magnetic memory and its reading/writing method.

In order to solve the aforementioned problem, the present application provides a magnetic memory that comprises at least one cell unit; the cell unit includes a plurality of parallel first wires, disposed in a first plane; a plurality of parallel second wires, disposed in a second plane, the first plane being parallel to the second plane, and projections of the second wires onto the first plane intercrossing the first wires; a plurality of storage elements, disposed between the first plane and the second plane, the storage elements including magnetic tunnel junctions and bi-directional gating components connected in series along a direction perpendicular to the first plane, the magnetic tunnel junctions being connected to the first wires, the bi-directional gating components being connected to the second wires, and the bi-directional gating components being configured to be conductive upon application of a threshold voltage and/or a threshold current; and a control module, for providing a first current and a second current during write operation, the first current passing through the first wires but not through the storage elements, the second current passing through selected storage elements, and the first current and the second current equalizing trends for the resistance of the magnetic tunnel junctions to increase or decrease.

The present application provides a reading/writing method of a magnetic memory, which method comprises providing a first current and a second current to the magnetic memory while performing write operation thereon, the first current passing through the first wires but not through the storage elements, the second current passing through selected storage elements, and the first current and the second current equalizing changing trends for the resistance of the magnetic tunnel junctions to increase or decrease.

BRIEF DESCRIPTION OF DRAWINGS

The aforementioned and other objectives, characteristics and advantages of the present application will become more lucid through the following description to the embodiments of the present application with reference to the accompanying drawings, in which.

DESCRIPTION OF EMBODIMENTS

In order to make the objectives, technical solutions and advantages of the present application more lucid and clear, the present application will be described in greater detail below in combination with specific embodiments with reference to the accompanying drawings. However, as should be understood, such description is merely exemplary in nature rather than restrictive to the scope of the present application. In addition, publicly known structures and technologies are not mentioned in the following description to avoid unnecessary confusion with the conception of the present application.

Figure 1:
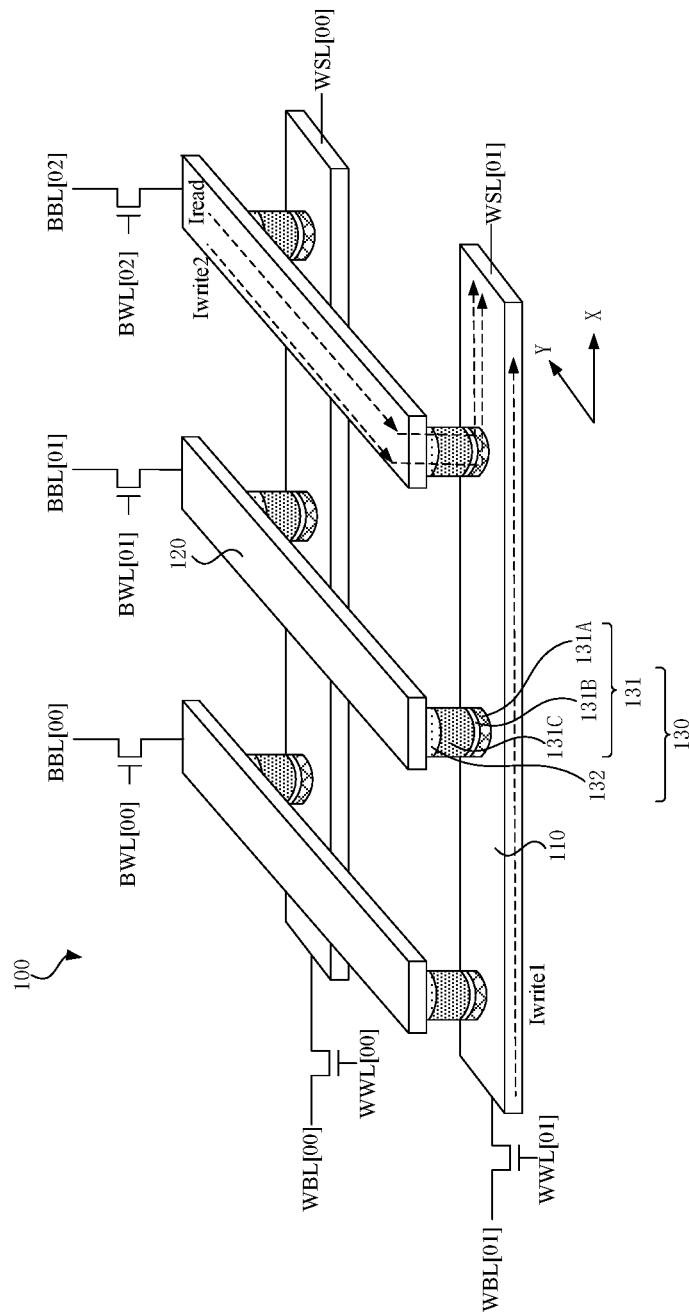
FIG. 1 is a diagram schematically illustrating the structure of a magnetic memory according to the first embodiment of the present application.

FIG. 1 is a diagram schematically illustrating the structure of a magnetic memory according to the first embodiment of the present application. Referring to FIG. 1, the magnetic memory according to the present application comprises at least one cell layer 100. In this embodiment, the magnetic memory comprises one cell layer 100.

The cell layer 100 includes a plurality of parallel first wires 110, a plurality of parallel second wires 120, a plurality of storage elements 130 and a control module (not shown in the Figure). Numbers of the first wires 110, second wires 120 and storage elements 130 can be set according to storage requirement of the magnetic memory. In FIG. 1 are merely exemplarily shown two first wires 110 arranged in parallel, three second wires 120 arranged in parallel, and six storage elements 130, and these do not constitute any restriction to the present application.

The first wires 110 are located in a first plane (not shown in the Figure). In this embodiment, the first wires 110 extend along direction X, and are arranged along direction Y, so the first plane is an XY plane.

The second wires 120 are located in a second plane (not shown in the Figure), and the first plane is parallel to the second plane. In this embodiment, the second wires 120 extend along direction Y, and are arranged along direction X, so the second plane is also an XY plane, while the first plane and the second plane are parallel planes.

Projections of the second wires 120 onto the first plane intercross the first wires 110, in other words, projections of the first wires 110 onto the second plane intercross the second wires 120. Specifically speaking, on the direction perpendicular to the first plane, projections of the second wires 120 onto the first plane intercross the first wires 110, in other words, on the direction perpendicular to the second plane, projections of the first wires 110 onto the second plane intercross the second wires 120. Since the first plane is parallel to the second plane, the first wires 110 and the second wires 120 would not directly intercross one another, whereas their projections intercross on a certain plane.

In this embodiment, projections of the second wires 120 onto the first plane perpendicularly intercross the first wires 110, whereas in other embodiments of the present application, projections of the second wires 120 onto the first plane do not intercross the first wires 110 perpendicularly, but intercross the later with an acute angle or an obtuse angle.

In this embodiment, in order to enhance the electrical conductivity of the first wires 110 and the second wires 120, the first wires 110 and the second wires 120 can be made of a heavy metal (such as Pt, Ta, etc.), a semimetal (such as $MoTe_2$) or a chalcogenide (such as $Bi_xTe_{1-x}$).

A plurality of the storage elements 130 are sandwiched between the first plane and the second plane. That is to say, the plurality of storage elements 130 are disposed in the interlayer formed between the first plane and the second plane. Each storage element 130 includes a magnetic tunnel junction 131 and a bi-directional gating component 132 connected in series along a direction perpendicular to the first plane. In this embodiment, the storage element 130 is disposed at the intercrossing of a first wire 110 and a second wire 120, the magnetic tunnel junction 131 is connected to the first wire 110, and the bi-directional gating component 132 is connected to the second wire 120. But in other embodiments of the present application, positions of the magnetic tunnel junction 131 and the bi-directional gating component 132 can also interchange, i.e., the magnetic tunnel junction 131 is connected to the second wire 120, and the bi-directional gating component 132 is connected to the first wire 110.

The bi-directional gating component 132 is configured to be conductive upon application of a threshold voltage and/or a threshold current. Such conduction is meant by the bi-directional gating component 132 changing from a high-resistance state to a low-resistance state. Specifically speaking, when the voltage or current applied on the bi-directional gating component 132 is a threshold voltage or threshold current, or exceeds a threshold voltage or threshold current, the bi-directional gating component 132 changes from a high-resistance state to a low-resistance state, whereby is realized electrical connection of the magnetic tunnel junction 131 to the second wire 120. The threshold voltage or threshold current depends on the material performance of the magnetic tunnel junction 131. For instance, in this embodiment, the material of the bi-directional gating component 132 is doped hafnium oxide whose conductive threshold voltage is 0.25V; when the voltage applied on the bi-directional gating component 132 is 0.25V or exceeds 0.25V, the bi-directional gating component 132 is conductive, when the voltage applied on the bi-directional gating component 132 is less than 0.25V, the bi-directional gating component 132 is not conductive. The doped hafnium oxide possesses a high on/off ratio, and a low on-resistance is a relatively ideal material for the bi-directional gating component. Of course, other materials capable of realizing threshold conduction function are also useable as materials of the bi-directional gating component 132, and the present application makes no restriction thereto.

Since the bi-directional gating component 132 can be conductive upon application of a threshold voltage and/or threshold current, different storage elements 130 can take the bi-directional gating components as control switches, to thereby realize respective controls of the storage elements 130. Specifically speaking, once it is required to operate on a certain storage element 130 or certain storage elements 130, the/those bi-directional gating component(s) 132 to which the certain or these certain storage element(s) 130 correspond(s) is/are controlled to be conductive, while other bi-directional gating components 132 to which unselected storage elements 130 correspond remain not conductive, thereby realizing selective operation on storage elements 130.

In this embodiment, the magnetic tunnel junction 131 includes a free layer 131A connected to the first wire 110, a nonmagnetic insulation layer 131B disposed on the upper surface of the free layer 131A, and a fixed layer 131C disposed on the upper surface of the nonmagnetic insulation layer 131B. Of these, magnetic moment direction of the free layer 131A is variable, and magnetic moment direction of the fixed layer 131C is invariable. Due to the tunnel magnetic resistance effect, the resistance value between the fixed layer 131C and the free layer 131A is varied with variation of the magnetic moment direction in the free layer 131A, whereby is realized the writing-in of the magnetic memory.

One end of the bi-directional gating component 132 is connected to the fixed layer 131C, and another end thereof is connected to the second wire 120. First end and second end of the bi-directional gating component 132 are provided merely to facilitate description, and there is no difference between the first end and the second end for the bi-directional gating component 132, that is to say, it suffices for any end of the bi-directional gating component 132 to connect to the fixed layer 131C.

The control module is employed for providing a first current and a second current during write operation, the first current passes through the first wire 110 but not through the storage element 130, the second current passes through a selected storage element 130, and the first current and the second current equalize trends for the resistance of the magnetic tunnel junction 131 to increase or decrease. That is to say, the first current provided by the first wire 110 and the second current passing through the storage element 130 exert a combined function on the magnetic tunnel junction to enable its resistance to increase or decrease.

The magnetic memory according to the present application changes conventional designs of magnetic memories, and greatly enhances storage density and storage speed of magnetic memories.

In this embodiment, the first wires 110 include first ends and second ends. The magnetic memory further comprises a plurality of write bitlines WBL and a plurality of first selection transistors WWL. The first selection transistors WWL are configured to electrically connect the first ends of the first wires 110 and the write bitlines WBL in response to a first control signal.

In this embodiment, in FIG. 1 are merely exemplarily illustrated two write bitlines WBL and two first selection transistors WWL, which are respectively write bitline WBL [00] and write bitline WBL[01] and first selection transistor WWL[00] and first selection transistor WWL[01]. Of these, since the write bitlines WBL are not improvement essential of the present application, they are only schematically shown by line segments in the Figure. The first selection transistor WWL[00] is configured to electrically connect the first end of a first wire 110 and the write bitline WBL[00] in response to a first control signal, and the first selection transistor WWL[01] is configured to electrically connect the first end of another first wire 110 and the write bitline WBL[01] in response to a first control signal.

In this embodiment, the magnetic memory further comprises source lines WSL, which are electrically connected to the second ends of the first wires 110, for instance, via a transistor switch. Specifically speaking, in FIG. 1 are merely exemplarily illustrated two source lines WSL, source line WSL[00] and source line WSL[01], respectively. The source line WSL[00] is electrically connected to the second end of a first wire 110, and the source line WSL[01] is electrically connected to the second end of another first wire 110.

In this embodiment, the magnetic memory further comprises a plurality of bitlines BBL and a plurality of second selection transistors BWL, and the second selection transistors BWL are configured to electrically connect the second wires 120 and the bitlines BBL in response to a second control signal. Specifically speaking, in FIG. 1 are merely exemplarily illustrated three bitlines BBL and three second selection transistors BWL, which are respectively bitline BBL[00], bitline BBL[01], bitline BBL[02], second selection transistor BWL[00], second selection transistor BWL[01], and second selection transistor BWL[02]. The second selection transistor BWL[00] is configured to electrically connect the second wire 120 and the bitline BBL[00] in response to a second control signal, the second selection transistor BWL[01] is configured to electrically connect the second wire 120 and the bitline BBL[01] in response to a second control signal, and the second selection transistor BWL[02] is configured to electrically connect the second wire 120 and the bitline BBL[02] in response to a second control signal.

Figure 2:
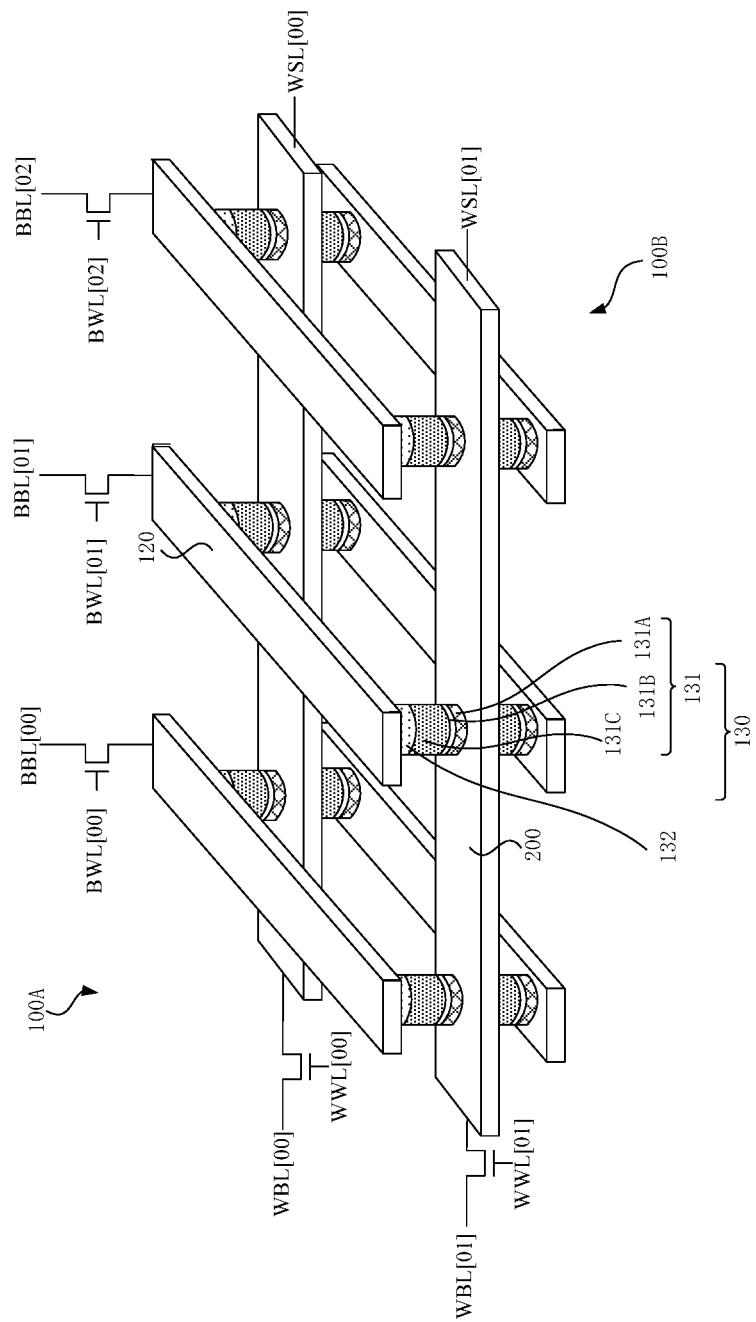
FIG. 2 is a diagram schematically illustrating the structure of a magnetic memory according to the second embodiment of the present application.
Figure 3:
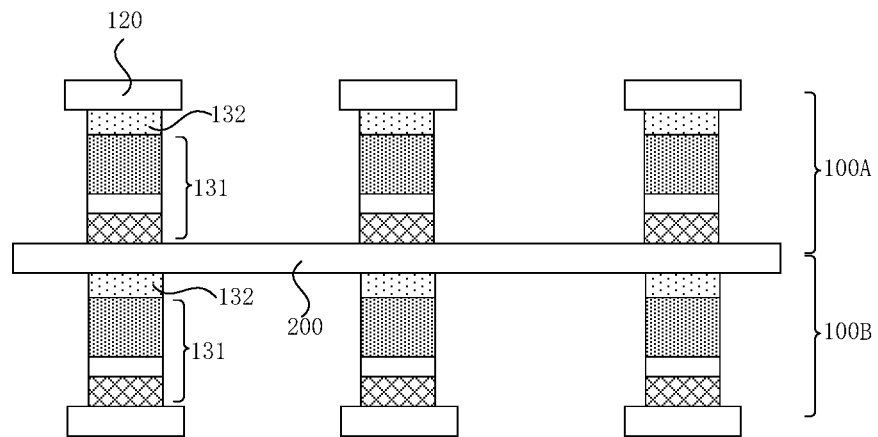
FIG. 3 is a front view of the structure shown in FIG. 2.

In order to further enhance the storage density of the magnetic memory, the present application further provides a second embodiment. The second embodiment differs from the first embodiment in including plural cell layers stacked one on the other. For specifics, refer to FIGS. 2 and 3, of which FIG. 2 is a diagram schematically illustrating the structure of a magnetic memory according to the second embodiment of the present application, and FIG. 3 is a front view of the structure shown in FIG. 2. In the second embodiment, the magnetic memory comprises a plurality of cell layers sequentially arranged along a direction perpendicular to the first plane. In this embodiment, the magnetic memory comprises two cell layers, an upper-level cell layer 100A and a lower-level cell layer 100B respectively, that are sequentially arranged along a direction perpendicular to the first plane.

The adjacent cell layers share the same and single wire, and this wire is used in the upper-level cell layer 100A as the first wire, and used in the lower-level cell layer 100B as the second wire. Specifically speaking, in this embodiment, the upper-level cell layer 100A and the lower-level cell layer 100B are adjacent cell layers, and the wire they share is wire 200. In the upper-level cell layer 100A, the wire 200 is connected to the magnetic tunnel junction 131 of the storage element 130, so the wire 200 serves as the first wire in the upper-level cell layer 100A; in the lower-level cell layer 100B, the wire 200 is connected to the bi-directional gating component 132, so the wire 200 serves as the second wire in the upper-level cell layer 100B.

Figure 4:
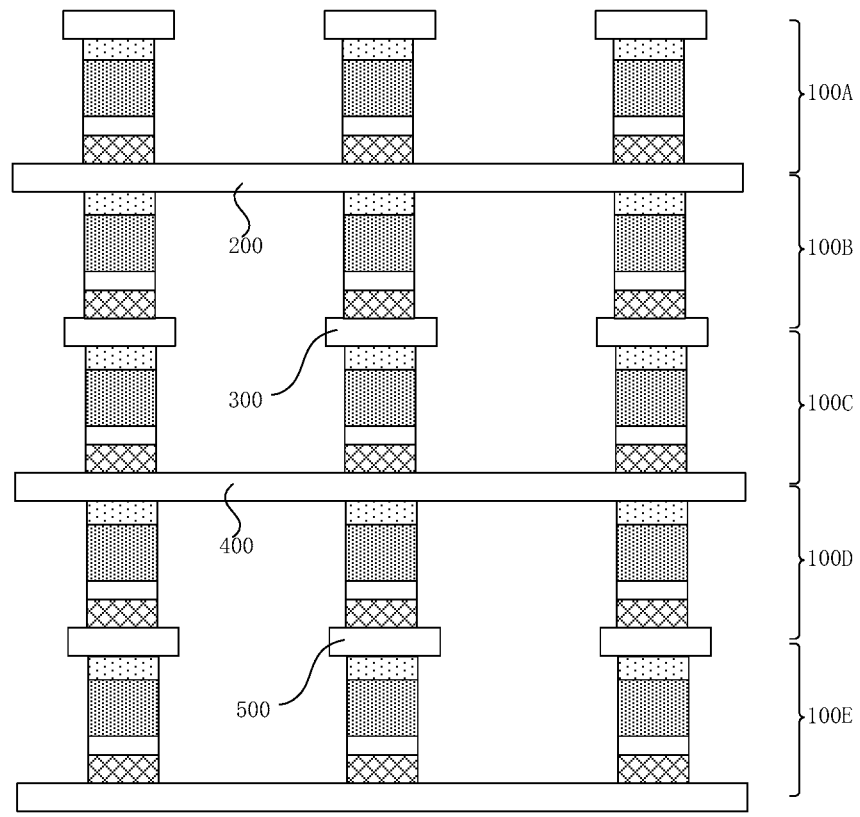
FIG. 4 is a front view of a magnetic memory according to the third embodiment of the present application.

The magnetic memory in the second embodiment only comprises two cell layers, while in other embodiments of the present application, in order to further enhance the storage density of the magnetic memory, the magnetic memory can comprise plural cell layers sequentially arranged along a direction perpendicular to the first plane. Referring to FIG. 4, which is a front view of a magnetic memory according to the third embodiment of the present application, in the third embodiment of the present application, the magnetic memory can comprise plural cell layers sequentially arranged along a direction perpendicular to the first plane. In FIG. 4 are merely exemplarily shown five cell layers, namely cell layer 100A, cell layer 100B, cell layer 100C, cell layer 100D and cell layer 100E, and these five cell layers are sequentially arranged along a direction perpendicular to the first plane.

Adjacent cell layers share the same and single wire, and the wire serves as the first wire in the upper-level cell layer and serves as the second wire in the lower-level cell layer. For instance, in the third embodiment, the cell layer 100A and the cell layer 100B are adjacent to each other, and the two share a wire 200, then the wire 200 is used as the first wire in the cell layer 100A and used as the second wire in the cell layer 100B; the cell layer 100B and the cell layer 100C are adjacent to each other, and the two share a wire 300, then the wire 300 is used as the first wire in the cell layer 100B and used as the second wire in the cell layer 100C; the cell layer 100C and the cell layer 100D are adjacent to each other, and the two share a wire 400, then the wire 400 is used as the first wire in the cell layer 100C and used as the second wire in the cell layer 100D; the cell layer 100D and the cell layer 100E are adjacent to each other, and the two share a wire 500, then the wire 500 is used as the first wire in the cell layer 100D and used as the second wire in the cell layer 100E.

In the second embodiment and the third embodiment, bi-directional gating components 132 of the storage elements 130 of all cell layers are located above magnetic tunnel junctions 131, so that the wire shared by adjacent cell layers is used as the first wire in the upper-level cell layer and used as the second wire in the lower-level cell layer. However, in other embodiments of the present application, bi-directional gating components 132 of the storage elements 130 can as well be located below magnetic tunnel junctions 131—the principle thereof is the same as those in the second embodiment and the third embodiment, and no repetition is made here.

In the second embodiment or the third embodiment of the present application, the connection relationships between the wire shared by adjacent cell layers and the storage element 130 are different in the two layers, that is to say, the wire shared by adjacent cell layers functions differently in the two layers. Another embodiment of the present application further provides a magnetic memory, and it differs from the second embodiment in that the connection relationships between the wire shared by adjacent cell layers and the storage element 130 are identical in the two layers, that is to say, the wire shared by adjacent cell layers functions identically in the two layers. In other words, the wire shared by adjacent cell layers is used in the upper-level cell layer and the lower-level cell layer both as the first wire or as the second wire.

Figure 5:
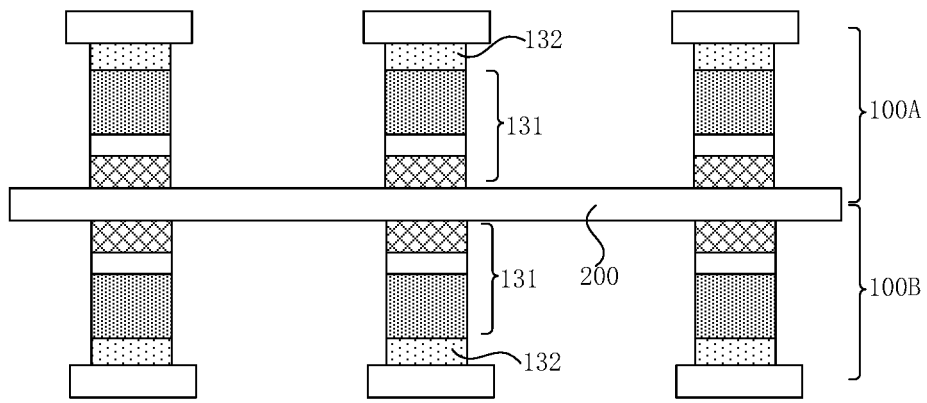
FIG. 5 is a front view of a magnetic memory according to the fourth embodiment of the present application.

For specifics, please refer to FIG. 5, which is a front view of a magnetic memory according to the fourth embodiment of the present application. In the fourth embodiment, the magnetic memory comprises two cell layers, namely upper-level cell layer 100A and lower-level cell layer 100B, and the upper-level cell layer 100A and lower-level cell layer 100B are sequentially arranged along a direction perpendicular to the first plane.

The upper-level cell layer 100A and the lower-level cell layer 100B share the same and single wire, and this wire is used in both the upper-level cell layer 100A and the lower-level cell layer 100B as the first wire or as the second wire. Specifically speaking, in this embodiment, the wire shared by the upper-level cell layer 100A and the lower-level cell layer 100B is wire 200. In the upper-level cell layer 100A, the wire 200 is connected to the magnetic tunnel junction 131 of the storage element 130, so the wire 200 is used as the first wire in the upper-level cell layer 100A; in the lower-level cell layer 100B, the wire 200 is connected to the magnetic tunnel junction 131 of the storage element 130, so the wire 200 is used also as the first wire in the lower-level cell layer 100B. In other embodiments of the present application, it is also possible to so transpose the storage element of each layer that the wire 200 is connected respectively to the magnetic tunnel junctions 131 of the storage elements 130 in the upper-level cell layer 100A and the lower-level cell layer 100B, in which case the wire 200 is used as the second wire.

Figure 6:
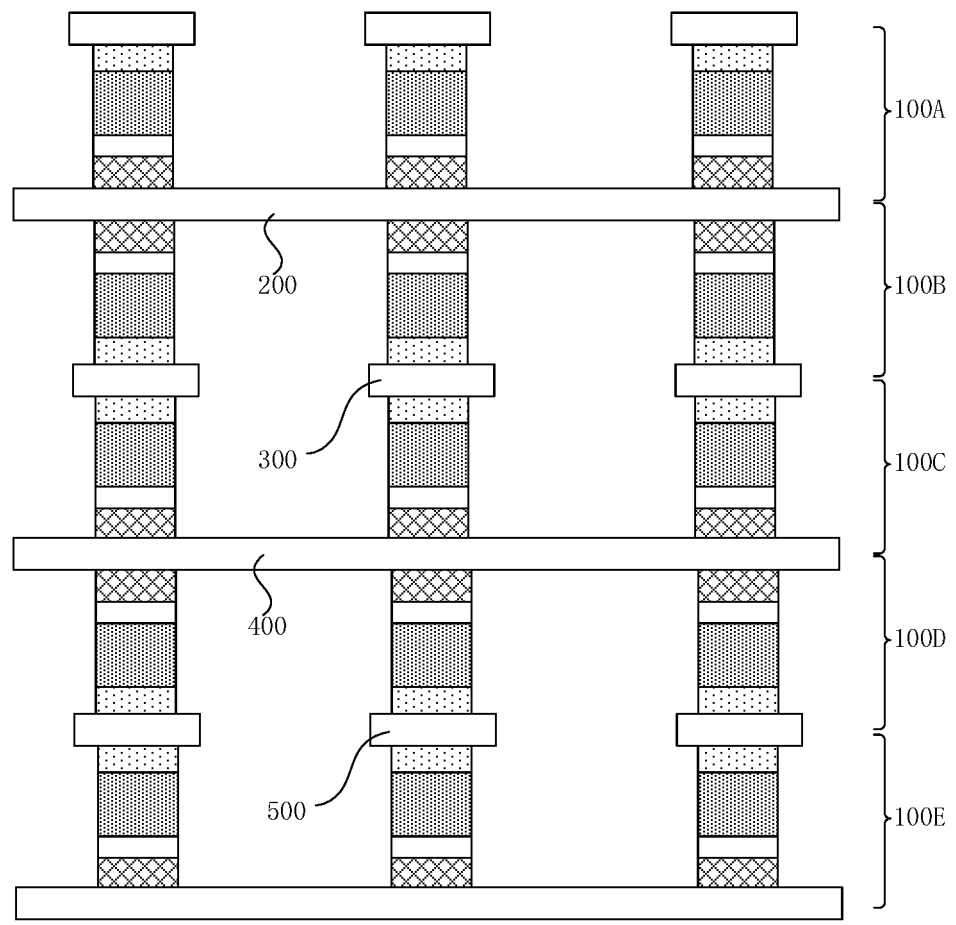
FIG. 6 is a front view of a magnetic memory according to the fifth embodiment of the present application.

The magnetic memory in the fourth embodiment only comprises two cell layers, while in other embodiments of the present application, in order to further enhance the storage density of the magnetic memory, the magnetic memory can comprise plural cell layers sequentially arranged along a direction perpendicular to the first plane. Referring to FIG. 6, which is a front view of a magnetic memory according to the fifth embodiment of the present application, in the fifth embodiment, the magnetic memory can comprise plural cell layers sequentially arranged along a direction perpendicular to the first plane. In FIG. 6 are merely exemplarily shown five cell layers, namely cell layer 100A, cell layer 100B, cell layer 100C, cell layer 100D and cell layer 100E, and these five cell layers are sequentially arranged along a direction perpendicular to the first plane.

Adjacent cell layers share the same and single wire, and the wire serves as the first wire or the second wire in the upper-level cell layer and the lower-level cell layer. For instance, in the fifth embodiment, the cell layer 100A and the cell layer 100B are adjacent to each other, the two share a wire 200, and the wire 200 is used as the first wire in the cell layer 100A and used also as the first wire in the cell layer 100B; the cell layer 100B and the cell layer 100C are adjacent to each other, the two share a wire 300, and the wire 300 is used as the second wire in the cell layer 100B and used also as the second wire in the cell layer 100C; the cell layer 100C and the cell layer 100D are adjacent to each other, the two share a wire 400, and the wire 400 is used as the first wire in the cell layer 100C and used also as the first wire in the cell layer 100D; the cell layer 100D and the cell layer 100E are adjacent to each other, the two share a wire 500, and the wire 500 is used as the second wire in the cell layer 100D and used also as the second wire in the cell layer 100E.

Understandably, in other embodiments of the present application, it is also possible to transpose the direction of the storage element 130 in each layer, and to change the connection relationship of the magnetic tunnel junction and the bi-directional gating component with respect to the shared wire—the connection principle thereof is the same as that in the fifth embodiment, and no repetition is made here.

In this embodiment, the drawings of the present application merely exemplarily show the interposition relationship among the first wires, the storage elements and the second wires, while in the actual semiconductor processing technique, insulation materials and other structural materials will be filled in the blanks left out by the first wires, storage elements and the second wires, and these are not mentioned in this context.

Figure 7:
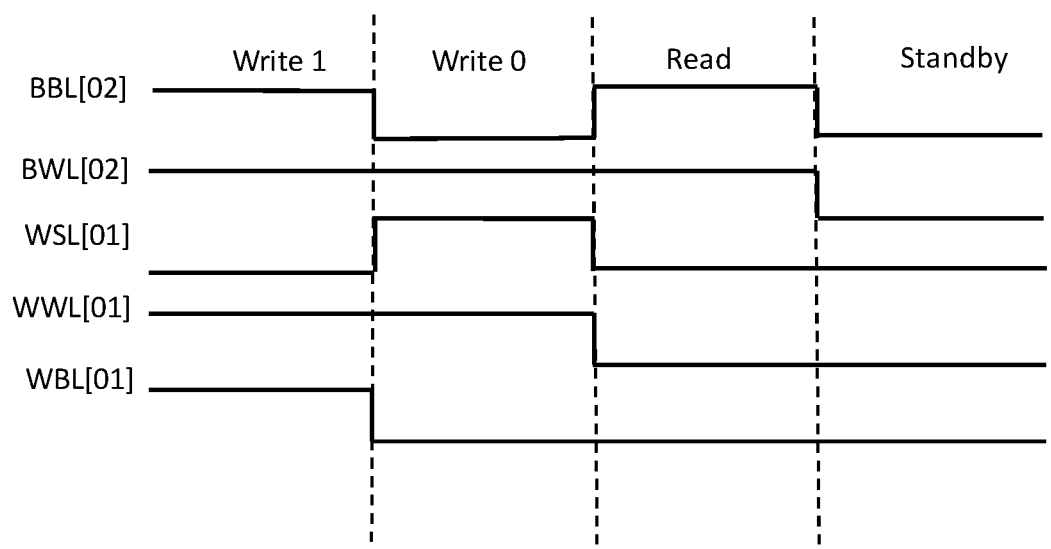
FIG. 7 is a diagram illustrating the timing sequence of a reading/writing method of a magnetic memory according to the sixth embodiment of the present application.

The present application further provides a reading/writing method of the magnetic memory recited above. Please refer to FIGS. 1-7, of which FIG. 7 is a diagram illustrating the timing sequence of a reading/writing method of a magnetic memory according to the sixth embodiment of the present application.

The reading/writing method according to the present application comprises: (write operation): providing a first current Iwrite1 and a second current Iwrite2 to the magnetic memory, the first current Iwrite1 passing through the first wires 110 but not through the storage elements 130, the second current Iwrite2 passing through selected storage elements 130, and the first current Iwrite1 and the second current Iwrite2 equalizing changing trends of the resistance of the magnetic tunnel junctions 131.

In the method, different storage elements realize respective controls with the bi-directional gating components 132 as control switches. In this step of write operation, the selected storage element is configured as the one when its bi-directional gating component 132 is applied with a threshold voltage and/or a threshold current. In other words, in this step, if it is required to operate a certain storage element 130, its bi-directional gating component 132 is placed in the conductive state, and the bi-directional gating components 132 of other storage elements 130 that are not required to be operated are placed in the nonconductive state, thereby realizing write operation on this selected storage element 130.

The first current Iwrite1 only passes through the first wire 110 and not through the storage element 130, and the first current Ieraser exerts function on the magnetic tunnel junction 131 through the first wire 110, so as to vary the magnetic moment direction of the free layer 131A of the magnetic tunnel junction 131, for instance, to make the magnetic moment direction of the free layer 131A to be the same as or reverse to the magnetic moment direction of the fixed layer 131C.

In this embodiment, the first selection transistor WWL is so controlled via the first control signal, that the first selection transistor WWL electrically connects the first end of the first wire 110 to the write bitline WBL in response to the first control signal. When the write bitline WBL is in a high level and the source line WSL is in a low level, the first current Iwrite1 passes from the write bitline WBL through the first wire 110 to the source line WSL. Alternatively, as in another embodiment of the present application, when the write bitline WBL is in a low level and the source line WSL is in a high level, the first current Ieraser1 passes from the source line WSL through the first wire 110 to the write bitline WBL.

The second current Iwrite2 passes through the selected storage element 130, then the second current Iwrite2 varies the magnetic moment direction of the free layer 131A, so that the magnetic moment direction of the free layer 131A is the same as or reverse to the magnetic moment direction of the fixed layer 131C.

In this embodiment, the second selection transistor BWL is controlled through the second control signal to be turned on, the bitline BBL is in a low level, the source line WSL is in a high level, and the second current Iwrite2 flows via the source line WSL from the first wire 110 through the storage element 130 and the second wire 120 to the bitline BBL. Alternatively, the bitline BBL is in a high level, the source line WSL is in a low level, and the second current Iwrite2 flows via the bitline BBL from the second wire 120 through the storage element 130 and the first wire 110 to the source WSL.

The first current Iwrite1 and the second current Iwrite2 equalize trends of the resistance of the magnetic tunnel junction 131. That is to say, the first current Iwrite1 and the second current Iwrite2 exert a combined function on the magnetic tunnel junction 131 to enable its resistance to increase or decrease, thereby realizing change in its storage states.

For example, in this embodiment, during write operation, the first current Iwrite1 makes the magnetic moment direction of the free layer 131A to vary toward a direction reverse to the magnetic moment direction of the fixed layer 131C, and the second current Iwrite2 also makes the magnetic moment direction of the free layer 131A to vary toward a direction reverse to the magnetic moment direction of the fixed layer 131C, so that the resistance of the storage element 130 increases and that the storage element 130 rests in a first storage state. In this embodiment, the first storage state can be storage "1". As should be noted, storage "0" can also be expressed as that the magnetic moment direction of the free layer 131A is reverse to the magnetic moment direction of the fixed layer 131C; as should be understood by persons skilled in the art, this is merely a differentiation in definition, and other definitions can be made as required.

For another example, in other embodiments, during write operation, the first current Iwrite1 makes the magnetic moment direction of the free layer 131A to vary toward a direction identical to the magnetic moment direction of the fixed layer 131C, and the second current Iwrite2 also makes the magnetic moment direction of the free layer 131A to vary toward a direction identical to the magnetic moment direction of the fixed layer 131C, so that the resistance of the storage element 130 decreases and that the storage element 130 rests in a second storage state. In this embodiment, the second storage state can be storage "0". As should be noted, storage "1" can also be expressed as that the magnetic moment direction of the free layer 131A is identical to the magnetic moment direction of the fixed layer 131C; as should be understood by persons skilled in the art, this is merely a differentiation in definition, and other definitions can be made as required.

In the magnetic memory according to the present application, the varying trend of the magnetic moment direction of the free layer 131A induced by the first current Iwrite1 is identical to the varying trend of the magnetic moment direction of the free layer 131A induced by the second current Iwrite2, the two actions are combined together to realize write operation on the magnetic memory. Relative to performing write operation on the magnetic memory by merely applying the second current, the second current according to the present application is relatively small, and this greatly lowers the damage to the magnetic tunnel junction of the storage element, and enhances reliability and service life of the magnetic memory.

Moreover, the present application further provides read operation on the magnetic memory.

In the read operation, a third current is supplied to the magnetic memory, and the third current Iread flows from the second wire 120 through the storage element 130 to the first wire 110.

Identical to the step of the write operation, different storage elements realize respective controls with the bi-directional gating components 132 as control switches. In the step of read operation, if it is required to perform read operation on a certain storage element 130, its bi-directional gating component 132 is placed in the conductive state, and the bi-directional gating components 132 of other storage elements 130 are placed in the nonconductive state, thereby realizing independent operation on this selected storage element 130, and preventing other storage elements 130 from affecting the read operation.

When the read operation is performed, the third current Iread passes through the storage element 130, then a potential difference occurs at the two ends of the storage element 130, and the resistance of the storage element 130 can be determined according to the magnitude of this potential difference, whereby can be obtained the directing relationship of the magnetic moment directions of the free layer 131A and the fixed layer 131C of the magnetic tunnel junction, and hence can be realized the reading of the storage state of the storage element 130. Alternatively, it is also possible to judge the storage state of the storage element 130 according to the magnitude of the third current Iread—this is freely designable by persons skilled in the art according to requirement.

In this embodiment, the second selection transistor BWL is controlled through the third control signal to be turned on, to enable the second selection transistor BWL to electrically connect the second wire 120 to the bitline BBL in response to the third control signal, so that the third current Iread flows through the selected storage element 130, to thereby obtain the storage state of this storage element 130.

The above is merely directed the reading/writing method of a single cell layer; for the magnetic memory having plural cell layers, its reading/writing method is the same as that of the single layer, and no repetition is made here.

In the above description, such technical details as the drawings and etchings of each layer are not described in detail. However, as should be understood by persons skilled in the art, it is possible to base on various means in the prior-art to form the layers and regions of the required shapes. In addition, in order to form the same structure, it is also possible for persons skilled in the art to design methods that are not necessarily identical to the method described above. Although the various embodiments are independently described, this does not mean that advantageous features in these embodiments could not be employed in combination.

As should be understood, the foregoing specific embodiments of the present application are merely directed to exemplarily describe or explain the principle of the present application, and do not constitute restriction to the present application. Accordingly, any modification, equivalent substitution and improvement makeable without departing from the spirit and scope of the present application shall all be contained within the protection scope of the present application. In addition, the Claims attached to the present application are meant to cover all variant and modified embodiments falling within the scope and boundary or modes of execution equivalent to such scope and boundary of the attached claims.

What is claimed is:

1. A magnetic memory, comprising a plurality of cell layers each of the plurality of cell layers comprising:
   a plurality of parallel first wires, disposed in a first plane;
   a plurality of parallel second wires, disposed in a second plane, the first plane being parallel to the second plane, and projections of the second wires onto the first plane intercrossing the first wires;
   a plurality of storage elements, disposed between the first plane and the second plane, the storage elements comprising magnetic tunnel junctions and bi-directional gating components connected in series along a direction perpendicular to the first plane, the magnetic tunnel junctions being connected to the first wires, the bi-directional gating components being connected to the second wires, and the bi-directional gating components being configured to be conductive upon application of at least one of a threshold voltage or a threshold current; and
   a control module, for providing a first current and a second current during a write operation, the first current passing through the first wires but not through the storage elements, the second current passing through selected storage elements, and the first current and the second current equalizing trends for resistances of the magnetic tunnel junctions to increase or decrease,
   wherein the plurality of cell layers are sequentially arranged along the direction perpendicular to the first plane, adjacent cell layers share a same and single wire, the wire is used as the first wire in upper-level cell layers and used as the second wire in lower-level cell layers.

2. The magnetic memory according to claim 1, wherein the magnetic tunnel junctions comprise:
   free layers connected to the first wires;
   nonmagnetic insulation layers disposed on upper surfaces of the free layers; and
   fixed layers disposed on upper surfaces of the nonmagnetic insulation layers, magnetic moment directions of the free layers being variable, and magnetic moment directions of the fixed layers being invariable; wherein one ends of the bi-directional gating components are connected to the fixed layers, and the other ends thereof are connected to the second wires.

3. The magnetic memory according to claim 1, wherein the first wires comprise first ends and second ends, the magnetic memory further comprises a plurality of write bitlines and a plurality of first selection transistors, and the first selection transistors are configured to electrically connect the first ends of the first wires to the write bitlines in response to a first control signal.

4. The magnetic memory according to claim 3, further comprising source lines electrically connected to the second ends of the first wires.

5. The magnetic memory according to claim 1, further comprising a plurality of bitlines and a plurality of second selection transistors, wherein the second selection transistors are configured to electrically connect the second wires to the bitlines in response to a second control signal.

6. A magnetic memory, comprising a plurality of cell lavers, each of the plurality of cell layers comprising:
   a plurality of parallel first wires, disposed in a first plane;
   a plurality of parallel second wires, disposed in a second plane, the first plane being parallel to the second plane, and projections of the second wires onto the first plane intercrossing the first wires:
   a plurality of storage elements, disposed between the first plane and the second plane, the storage elements comprising magnetic tunnel junctions and bi-directional gating components connected in series along a direction perpendicular to the first plane, the magnetic tunnel junctions being connected to the first wires, the bi-directional gating components being connected to the second wires, and the bi-directional gating components being configured to be conductive upon application of at least one of a threshold voltage or as threshold current; and
   a control module, for providing a first current and a second current during a write operation, the first current passing through the first wires but not through the storage elements, the second current passing through selected storage elements, and the first current and the second current equalizing trends for resistances of the magnetic tunnel junctions to increase or decrease,
   wherein the plurality of cell layers are sequentially arranged along the direction perpendicular to the first plane, adjacent cell layers share a same and single wire, Wherein the wire is used in upper-level cell layers and lower-level cell layers both as the first wire or the second wire.

7. A reading/writing method of a magnetic memotv, wherein the magnetic memory comprises at least one cell layer, and the cell layer comprises:
   a plurality of parallel first wires, disposed in a first plane;
   a plurality of parallel second wires, disposed in a second plane, the first plane being parallel to the second plane, and projections of the second wires onto the first plane intercrossing the first wires; and
   a plurality of storage elements, disposed between the first plane and the second plane; the storage elements comprising magnetic tunnel junctions and bi-directional gating components connected in series along a direction perpendicular to the first plane, the magnetic tunnel junctions being connected to the first wires, the bi-directional gating components being connected to the second wires, and the bi-directional gating components being configured to be conductive upon application of at least one of a threshold voltage or a threshold current; wherein the first wires comprise first ends and second ends, the magnetic memory further comprises a plurality of write bitlines and a plurality of first selection transistors, and the first selection transistors are configured to electrically connect the first ends of the first wires to the write Wines in response to a first control signal;
   the reading writing method comprising:
   providing a first current and a second current to the magnetic memory while performing a write operation thereon, the first current passing through the first wires but not through the storage elements, the second current passing through selected storage elements, and the first current and the second current equalizing changing trends for resistances of the magnetic tunnel junctions to increase or decrease;
   the reading writing method further comprising:
   controlling the first selection transistors through the first control signal, so that the first selection transistors electrically connect the first ends of the first wires to the write bitlines in response to the first control signal, so as to enable the first current to pass through the first wires but not through the storage elements.

8. The reading/writing method according to claim 7, wherein the magnetic tunnel junctions comprise:
free layers connected to the first wires;
nonmagnetic insulation layers disposed on upper surfaces of the free layers; and
fixed layers disposed on upper surfaces of the nonmagnetic insulation layers, magnetic moment directions of the free layers being variable, and magnetic moment directions of the fixed layers being invariable; wherein
one ends of the bi-directional gating components are connected to the fixed layers, and the other ends thereof are connected to the second wires;
the reading/writing method further comprising:
equalizing, by the first current and the second current, trends for the magnetic moment directions of the free layers to vary.

9. The reading/writing method according to claim 8, wherein the trends for the magnetic moment directions of the free layers to vary are that the magnetic moment directions of the free layers vary towards the same direction or reverse direction with respect to the magnetic moment directions of the fixed layers.

10. The reading/writing method according to claim 7, wherein the magnetic memory farther comprises a plurality of Mines and a plurality of second selection transistors, wherein the second selection transistors are configured to electrically connect the second wires to the bitlines in response to a second control signal;
the reading/writing method further comprising:
controlling the second selection transistors through the second control signal, so that the second selection transistors electrically connect the second wires to the bitlines in response to the second control signal, so as to enable the second current to pass through the selected storage elements.

11. The reading/writing method according to claim 10, wherein the magnetic memory further comprises source lines electrically connectable to the second ends of the first wires;
the reading/writing method further comprising:
the first current flowing from the write bitlines through the first wires to the source lines, or the first current flowing from the source lines through the first wires to the write bitlines.

12. The reading/writing method according to claim 11, wherein the write bitlines are capable of providing a high level or a low level, and the source lines are capable of providing a high level or a low level;
the reading/writing method further comprising:
in the step of providing the first current, the write bitlines providing the high level, and the source lines providing the low level, alternatively, the write bitlines providing the low level, and the source lines providing the high level.

13. The reading/writing method according to claim 12, wherein the bitlines are capable of providing a high level or a low level;
the reading/writing method further comprising:
in the step of providing the first current, the bitlines providing the high level, and the source lines providing the low level, alternatively, the bitlines providing the low level, and the source lines providing the high level.

14. The reading/writing method according to claim 7, further comprising: providing the magnetic memory with a third current while performing a read operation, the third current flowing from the second wires through the storage elements to the first wires.

15. The reading/writing method according to claim 14, wherein the magnetic memory further comprises a plurality of bitlines and a plurality of second selection transistors, and the second selection transistors are configured to electrically connect the second wires to the bitlines in response to a second control signal;
the reading/writing method further comprising:
controlling the second selection transistors through the second control signal, so that the second selection transistors electrically connect the second wires to the bitlines in response to the second control signal, so as to enable the third current to flow from the second wires through the storage elements to the second ends of the first wires.

16. The reading/writing method according to claim 15, wherein the magnetic memory further comprises source lines electrically connectable to the second ends of the first wires;
the reading/writing method further comprising:
the third current flowing from the second wires through the storage elements and the first wires to the source lines.

17. The reading/writing method according to claim 7, wherein different storage elements realize respective controls with the bi-directional gating components as control switches; and the selected storage elements are configured as storage elements whose bi-directional gating components reach the threshold voltage in the step of providing the first current and the second current to the magnetic memory.

* * * * *